United States Patent [19]
Poguntke et al.

[11] Patent Number: 5,351,262
[45] Date of Patent: Sep. 27, 1994

[54] MULTI-STRIPE ARRAY GRATING INTEGRATED CAVITY LASER

[75] Inventors: Kai R. Poguntke, Tinton Falls; Julian B. D. Soole, Atlantic Highlands, both of N.J.

[73] Assignee: Bell Communications Research, Inc., Livingston, N.J.

[21] Appl. No.: 943,273

[22] Filed: Sep. 10, 1992

[51] Int. Cl.$^5$ ............................................. H01S 3/08
[52] U.S. Cl. ...................................... 372/102; 372/97
[58] Field of Search ....................... 372/102, 43, 50, 97

[56] References Cited

U.S. PATENT DOCUMENTS

| | | | |
|---|---|---|---|
| 4,502,144 | 2/1985 | Suhra | 372/102 |
| 4,773,063 | 9/1988 | Hunsperger et al. | 385/37 |
| 4,913,525 | 4/1990 | Asakura et al. | 372/102 |
| 4,934,784 | 6/1990 | Kapany et al. | 372/102 |
| 5,029,176 | 7/1991 | Chang-Hasnain | 372/50 |
| 5,052,013 | 9/1991 | Putnam | 372/102 |
| 5,115,444 | 5/1992 | Kirkby et al. | 372/102 |
| 5,185,754 | 2/1993 | Craig et al. | 372/50 |
| 5,206,920 | 4/1993 | Cremer et al. | 385/47 |

FOREIGN PATENT DOCUMENTS 2225482A  5/1990  United Kingdom ......... H01S 3/105

OTHER PUBLICATIONS

J. B. D. Soole et al., "Multistripe array grating integrated cavity (MAGIC) laser: A new semiconductor laser for WDM applications," *Electronics Letters*. Jan. 1992, vol. 28, pp. 1805–1807.
C. E. Zah et al., "1.5 μm tensile-strained single quantum well 20-wavelength distributed feedback laser arrays," Electronics Letters, Jan. 1992, vol. 28, pp. 1585–1587.
M. Gibbon et al., "Optical performance of integrated 1.5 μm grating wavelength-demultiplexer on InP-based waveguide," *Electronics Letters, Jan. 1989, vol. 25, pp. 1441–1442.*
C. Cremer et al., "Grating spectrograph in InGaAsP/InP for dense wavelength division multiplexing," Applied Physics Letters, Jan. 1991, vol. 59, pp. 627–629.
J. B. D. Soole et al., "Monolithic InP/InGaAsP/InP grating spectrometer for the 1.48–1.56 μm wavelength range," *Applied Physics Letters,* Jan. 1991, vol. 58, pp. 1949–1951.
P. A. Kirkby, "Multichannel Wavelength-Switched Transmitters and Receivers—New Component Concepts for Broad-Band Networks and Distributed Switching Systems," *Journal of Lightwave Technology,* Jan. 1990, vol. 8, pp. 202–211.
I. H. White et al., "Demonstration of a Two Wavelength Multichannel Grating Cavity Laser", Jan. 1989, European Conference on Optical Communications, pp. 210–211.
I. H. White et al., "Demonstration of a 1 x 2 multichannel grating cavity laser for wavelength division multiplexing (WDM) applications," *Electronics Letters,* Jan. 1990, vol. 26, pp. 832–834.
I. H. White et al., "Crosstalk compensated WDM signal generation using a multichannel grating cavity laser," Jan. 1991, European Conference on Optical Communications, pp. 689–692.

(List continued on next page.)

*Primary Examiner*—Rodney B. Bovernick
*Assistant Examiner*—Robert E. Wise
*Attorney, Agent, or Firm*—Leonard Charles Suchyta; James W. Falk

[57] ABSTRACT

An integrated, multi-wavelength laser having formed on a substrate (12) a plurality of active, individually selectable waveguides (14), a passive output waveguide (16), and a diffraction grating (18) formed in a Rowland-circle spectrometer geometry. The frequency of the lasing light is determined by the geometrical relationship of the selected active waveguide, the diffraction grating, and the output waveguide. The active waveguides are positioned such that lasing light cannot diffract between two active waveguides. Little crosstalk occurs because no carrier depletion occurs in the output waveguide.

10 Claims, 3 Drawing Sheets

OTHER PUBLICATIONS

K. O. Nyairo et al., "Multichannel grating cavity (MGC) laser transmitter for wavelength division multiplexing applications," *IEE Proceedings-J*, Jan. 1991, vol. 138, pp. 337–342.

M. C. Farries et al., "Tuneable Multiwavelength semiconductor laser with single fibre output," *Electronics Letters*, Jan. 1991, vol. 27, pp. 1498–1499.

D. J. Pratt et al., "Four channel multiple wavelength laser transmitter module for 1550 nm WDM systems," *Electronics Letters*, Jan. 1992, vol. 28, pp. 1066–1067.

A. Scherer et al., "Fabrication of microlasers and microresonator optical switches," *Applied Physics Letters*, Jan. 1989, vol. 55, pp. 2724–2726.

MULTI-STRIPE ARRAY GRATING INTEGRATED CAVITY LASER

FIELD OF THE INVENTION

The invention relates generally to semiconductor lasers; in particular, it relates to multi-wavelength integrated semiconductor lasers.

BACKGROUND ART

Multi-wavelength semiconductor lasers are needed for several applications, particularly for wavelength-division multiplexing (WDM) telecommunications systems including computer buses. In such systems, multiple lasers each emitting at a different frequency are separately modulated by different data signals, and all the so modulated optical carriers are impressed on a single optical fiber. At the receiving end of the fiber, the separate optical wavelengths are separated by a spectrometer or other wavelength-sensitive means so that each single optical channel can be extracted from the fiber and detected. The absorption spectrum of the silica fiber used in long-distance telecommunication networks dictates that the optical carriers be in the 1.3 or 1.5 $\mu$m bands available in InP and related active opto-electronic materials while the shorter computer buses can use the 0.8 $\mu$m band available in GaAs.

For economy and ease of operation, the multiple lasers should be integrated on a single integrated circuit chip, that is, an opto-electronic integrated circuit (OEIC). Chang-Hasnain has disclosed a method of fabricating an array of vertical-cavity, surface-emitting lasers emitting at different wavelengths in U.S. Pat. No. 5,029,176. Although her method allows the fabrication of a large number of individual lasers, present designs for communication networks do not foresee a need for more than 20 to 40 separate wavelengths separated by about 1 or 2 nm. Her design suffers from doubts about its reproducibility, its incompatibility with wafer-scale fabrication, and the vertical emission of the laser light. It would be preferred to retain a planar geometry for ease of packaging.

A different approach uses distributed feedback (DFB) edge-emitting lasers in which separate Bragg diffraction gratings determine the lasing wavelengths. The period of the gratings are tailored for the separate wavelengths. The state of the art in this approach, presently about 20 lasers on a single integrated circuit chip, is disclosed by Zah et al. in "1.55 $\mu$m tensile-strained single quantum well 20-wavelength distributed feedback laser arrays", Electronics Letters, vol. 28, 1992, pp.1585-1587. This approach suffers from two disadvantages. First, if the laser integrated circuit is to attain a channel spacing of about 1 nm, then the variation in the periods of the diffraction gratings and other portions of the structure must be controlled to about this same distance. The etching and lithography becomes very difficult in satisfying such tight dimensional control. Secondly, the efficient coupling of the multiple laser emissions into a single optical fiber remains unsolved. Of course, bulk optical lenses could be used to focus the outputs to the small fiber core, but such an approach would be neither economical nor rugged.

Several groups have proposed fabricating an OEIC spectrometer which could be integrated with multiple detectors for a WDM application. See, for example, Gibbon et al. in "Optical performance of integrated 1.5 $\mu$m grating wavelength-demultiplexer on InP-based waveguide," Electronics Letters, vol. 25, 1989, pp. 1441-1442, Soole et al. in "Monolithic InP/InGaAsP/InP grating spectrometer for the 1.48-1.56 $\mu$m wavelength range," Applied Physics Letters, vol. 58, 1991, pp. 1949-1951, and Cremer et al. in "Grating spectrograph in InGaAsP/InP for dense wavelength division multiplexing" Applied Physics Letters, vol. 59, 1991, pp. 627-629. In these approaches, multiple waveguides are formed in the surface of an OEIC. One of the waveguides acts as an input waveguide receiving light from off the chip. The input light exits the input waveguide on its interior end and irradiates a vertically arranged diffraction grating formed into the chip's surface. The grating spectrally separates the light to the other waveguides, which act as output waveguides. Separate optical detectors are fabricated on or otherwise associated with the output waveguides for detecting the spectral components of the light. Such a design could conceivably be adapted for parallel DFB lasers formed in such waveguides, but it would not be satisfactory. The DFB gratings would still require precise lithography. Also, the diffraction grating would not be completely decoupled from the optical cavities of the DFB lasers, and the coupled cavities would necessitate a complex and constrained design. Pratt et al. disclose a related bulk-optical design in "Four channel multiple wavelength laser transmitter module for 1550 nm WDM systems, " Electronics Letters, vol. 28, 1992, pp. 1066-1067.

A related design for a multi-wavelength laser array takes advantage of the resonances of the optical cavity associated with the diffraction grating, as has been disclosed by Kirkby et al. in U.K. Patent Application, 2,225,482A: by Kirkby in "Multichannel Wavelength-Switched Transmitters and Receivers—New Component Concepts for Broad-Band Networks and Distributed Switching Systems," Journal of Lightwave Technology, vol. 8, 1990, pp. 202-211; by White et al. in "Demonstration of a Two Wavelength Multichannel Grating Cavity Laser," 12th International Conference on Semiconductor lasers, 1990, pp. 210-211, in "Demonstration of a 1×2 multichannel grating cavity laser for wavelength division multiplexing (WDM) applications," Electronics Letters, vol. 26, 1990, pp. 832-834, and in "Crosstalk compensated WDM signal generation using a multichannel grating cavity laser," European Conference on Optical Communications, 1991, pp. 689-692; by White in "A Multichannel Grating Cavity Laser for Wavelength division Multiplexing Applications," Journal of Lightwave Technology, vol. 9, 1991, pp. 893-898; and by Nyairo et al. in "Multichannel grating cavity (MGC) laser transmitter for wavelength division multiplexing applications," Journal of IEE-J Proceedings, vol. 138, 1991, pp. 337-342. Although Kirkby et al.'s patent application suggests an integrated design, the experimental results of this work involves a separate planar diffraction grating, a bulk lens, and a laser bar of active waveguides formed in a chip. Multiple parallel rib waveguides are formed in the laser bar, each of which could be separately electrically pumped. One waveguide serves as the master amplifier guide while the remainder of the waveguides serves as active reflector guides. None of the waveguides are frequency selective within the overall bandwidth of the laser array, that is, no distributed feedback nor Bragg reflective gratings are formed over the waveguides. Lasing is achieved by simultaneously driving both the master amplifier and a selected one of the reflectors. The combination of master amplifier and selected reflector determine the lasing wavelength because the diffraction grating controls which wavelength propagates between the two. The design ensures that no single rib can lase on its own. The advantage of this approach is that the lasing wavelengths are determined by the relative spatial positions of the waveguides and the diffraction grating, a much easier arrangement to set up than the fabrication of DFB gratings. However, simultaneous multi-wavelength emission creates a problem because the cavities for the different wavelengths, whether in the bulk optical structure or the proposed integrated structure, all include the one active master amplifier. Carrier depletion introduces significant crosstalk between the wavelength channels as they interact in the master amplifier. White et al. in the last paper cited above and Nyairo et al. attempt to suppress the crosstalk with active feedback control or other methods. However, such suppression is considered unsatisfactory because of its active nature. Farries et al. have disclosed an external cavity multi-wavelength laser in "Tuneable multiwavelength semiconductor laser with single fibre output," Electronics Letters, vol. 27, 1991, pp. 1498–1499. Their device uses a bar similar to Kirkby's for a laser array with no frequency determination and relies on lenses and a bulk diffraction grating to define a multi-wavelength cavity.

SUMMARY OF THE INVENTION

The invention may be summarized as a multi-wavelength integrated cavity laser in which a plurality of active waveguides of wide gain bandwidth, a passive output waveguide, and a diffraction grating are formed in a substrate. The geometrical relationship of the elements determines the lasing wavelengths of the active waveguides, which can be independently activated. All wavelengths are coupled into the passive output waveguide.

DETAILED DESCRIPTION OF THE PREFERRED EMBODIMENT

Figure 1:
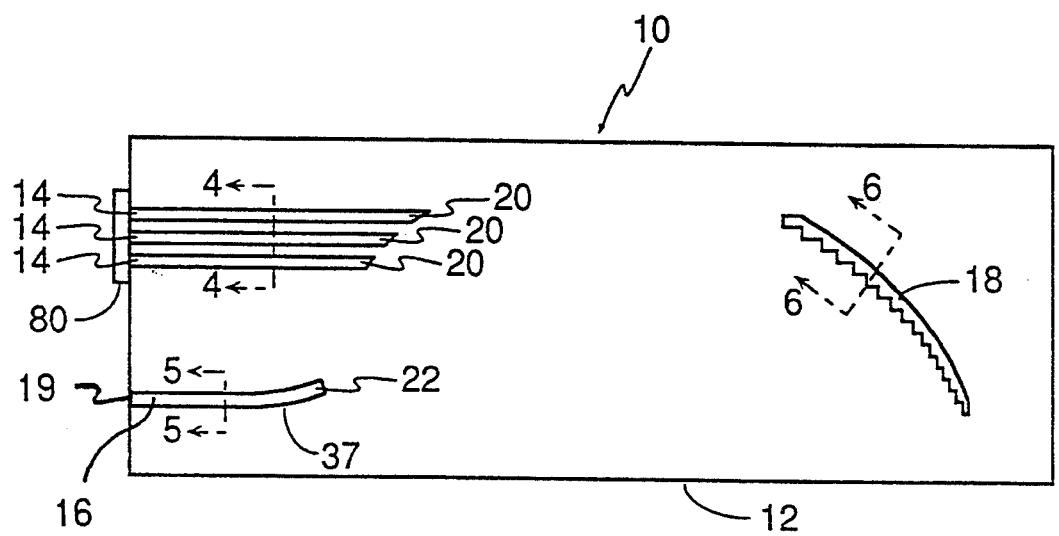
FIG. 1 is a plan view of a multi-wavelength integrated laser of the invention.

An embodiment of an integrated multi-wavelength laser 10 is illustrated in plan view in FIG. 1. On a substrate 12 of a single integrated circuit chip 10 are formed a plurality of active waveguide stripes 14, a passive output waveguide 16, and a diffraction grating 18. Interior ends 20 of the active stripes 14, an interior end 22 of the output waveguide 16, and the diffraction grating 18 are formed in a Rowland-circle focusing geometry to be described in more detail later. Each of the active stripes 14 can be separately electrically pumped so as to output light from its interior end 20. This light diffracts from the diffraction grating 18 to the output waveguide 16.

An optical cavity is set up within and between the active stripes 14 and the output waveguide 16, and the Rowland-circle geometry between each active stripe 14, the grating 18, and the output waveguide 16 determines the resonant wavelength (frequency) of the stimulated light emitted by that active stripe 14. The resulting laser light is emitted from the laser device 10 through an external end facet 19 of the output waveguide 16. If more than one of the active stripes 14 are electrically pumped, multiple wavelengths are emitted from the exterior end 19 of the output waveguide 16. There are no Bragg diffraction gratings or other frequency selective means operatively associated with the separate active stripes 14 beyond the gain bandwidth and other frequency-limiting features of the entire laser, which encompasses all the selectable wavelengths.

Figure 2:
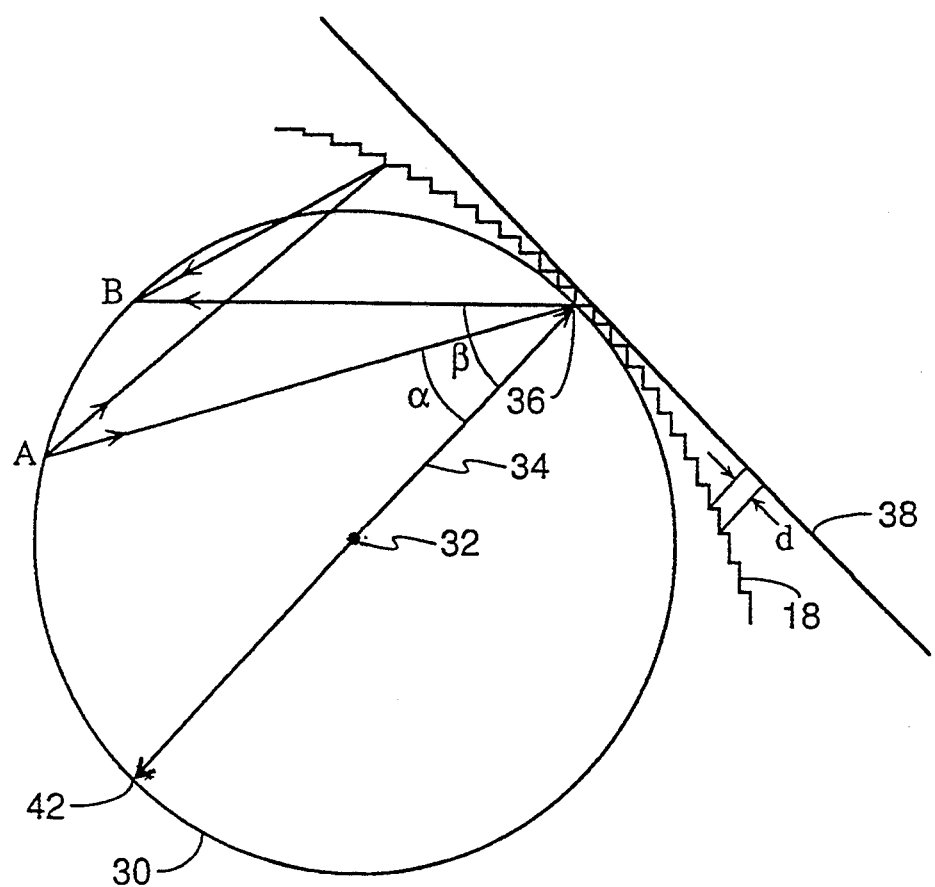
FIG. 2 is a schematic diagram of the geometry of a Rowland-circle spectrometer.

The Rowland circle geometry, illustrated schematically in FIG. 2, is well known in x-ray optics. A Rowland circle 30 has a radius R/2 about a center 32. A circle diameter 34 defines at one end a tangent point 36 with a straight tangent 38 and a circular grating 18. The grating 18 has a radius R about the other end 42 of the circle diameter 34 and has a constant pitch d as projected on the straight tangent 38. As is well known, if the diffraction grating 18 has a large extent, the pitch d needs to vary along its length in order to reduce optical aberrations. In x-ray diffraction, a Rowland-circle spectrometer is usually used to spectrally separate and focus a multi-wavelength source at point A to a photographic plate or other detector at or surrounding point B, but in the laser of the invention point B is associated with the active stripes 14 and point A with the output waveguide 16. The diffraction condition is given by $$d(\sin\alpha + \sin\beta) = \frac{p\lambda}{n}, \quad (1)$$

where $\alpha$ and $\beta$ are the angles between the respective lines connecting points A and B with the tangent point 36 and the circle diameter 34, $\lambda$ is the free-space wavelength of the light, n is the index of refraction of the medium within the Rowland circle 30, and p is the diffraction order, a non-zero integer. Assuming that $\alpha$ is fixed, there is a different $\beta$ for each $\lambda$.

Figure 3:
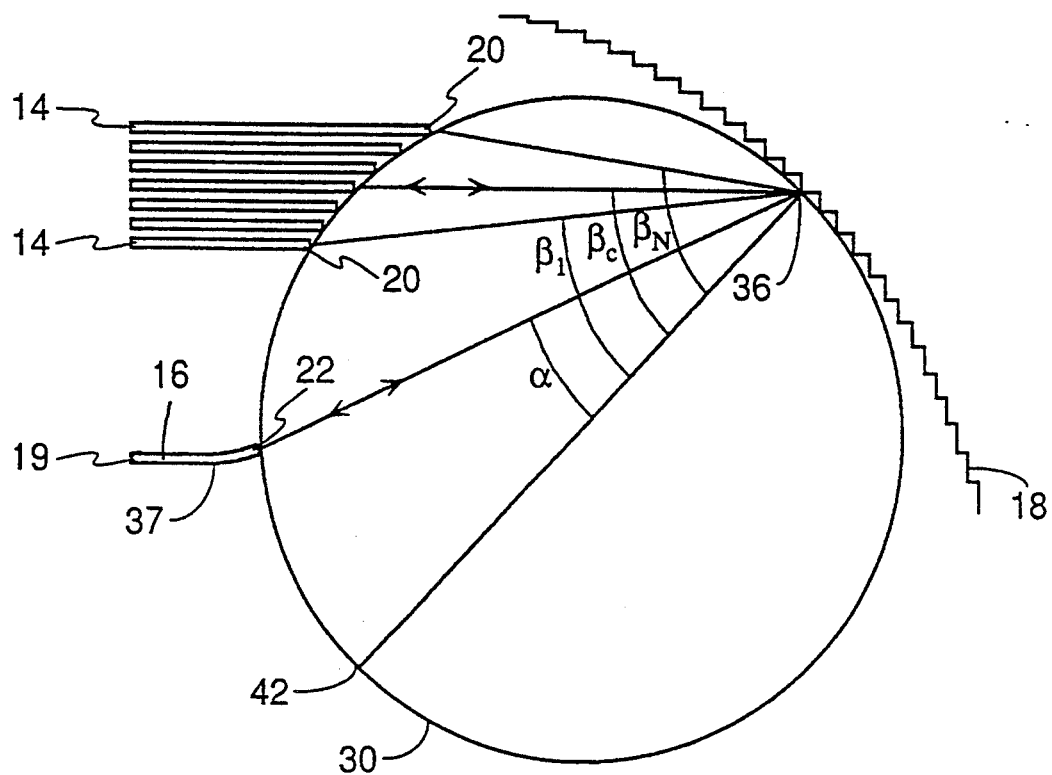
FIG. 3 is a diagram, partially in plan view and partially schematic, of the Rowland circle applied to the laser of the invention.

As applied to the present invention, as illustrated in FIG. 3, the interior ends 20 of N parallel active stripes 14 are positioned about point B from angle $\beta_1$ to $\beta_N$, with corresponding resonance wavelengths $\lambda_1$ to $\lambda_N$ as determined by Equation (1). The central active stripe 14, having an angle $\beta_c$ is aligned with the tangent point 36. The interior end 22 of the output waveguide 16 is positioned at point A at angle $\alpha$. Although the output waveguide 16 is generally parallel to the active stripes 14, for the sake of light-gathering efficiency, it has a curved portion 37 so that its interior end 22 is aligned with the tangent point 36, that is, bears an angle $\alpha$ with the perpendicular 34 to the line tangent 38 of the diffraction grating 18.

The resonant wavelengths $\lambda_1$ to $\lambda_N$ are determined by the Rowland-circle geometry and not by individualized structures of the active stripes 14. When one or more of the active stripes 14 are electrically pumped, the output waveguide 16 receives light at the one or more resonant wavelengths associated with those active stripes 14. Because there is no electrical pumping or other gain in the output waveguide 16, crosstalk associated with carrier depletion is eliminated. The resonant cavity of the multi-wavelength laser includes the optical path between the selected active stripe, the diffraction grating, and the output waveguide, and all of the active stripe and output waveguide. For lasing to occur, a significant portion of the light coupling into the output waveguide must be reflected back toward the selected active stripe.

We are pursuing an implementation of the laser of the invention. It is designed to emit around 1.545 μm from 8 active stripes. The spectrometer is designed with a Rowland radius R of 13 mm, a grating spacing d of 5 μm, an angular extent of the grating of 20° with respect to the output waveguide, and an effective index of refraction n of 3.244. The diffraction order p is 17-th order. The angular spacing α of the output waveguide is 48°, and the active stripes are spaced at β between 60° and 64°. As a result, the lateral spacing of the active stripes is about 50 μm. Variable blazing is used on the diffraction grating so that, all along the grating, light is specularly reflected off the grating facets between the center of the stripe array and the output waveguide.

The above geometrical dimensions allow a design that suppresses lasing between two active stripes directly linked through the diffraction grating. The active-to-passive coupling occurs in 17th order for p at wavelengths λ between 1.530 and 1.558 μm according to Equation (1). The corresponding equation for light diffracted between two active stripes i and j is given by $$d(\sin\beta_i + \sin\beta_j) = \frac{p'\lambda}{n}, \quad (2)$$

According to this equation, the active-to-active coupling occurs in 19th order in p' for wavelengths between 1.479 and 1.529 μm and in 18th order between 1.561 and 1.614 μm. Also, according to Equation (1), the active-to-passive coupling for 18th and 16th order in p occur at wavelengths between 1.445–1.471 and 1.626–1.656 μm, respectively. Thereby, the desired wavelength band avoids the band of any undesired reflections. To take advantage of this separation, the gain peak of the active medium is centered within the desired band through choice of the composition and thicknesses of layers comprising the multi-quantum wells so that the active-to-active modes have lower gain than the desired active-to-passive modes. If a mode is to lase, its gain less its loss per round trip within the cavity must be equal to zero. The above described grating blazing reduces the light backscattered to another active stripe and thus increases the loss of the active-to-active modes to the point where lasing cannot occur. Only the active-to-passive coupling and associated gain spectrum are high enough to support lasing.

Figure 4:
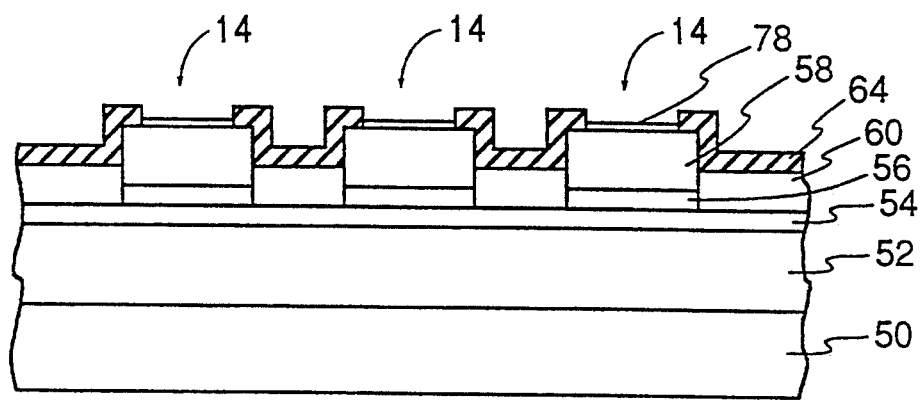
FIG. 4 is a cross-sectional view of the active stripes taken along sectional line 4—4 of FIG. 1.
Figure 5:
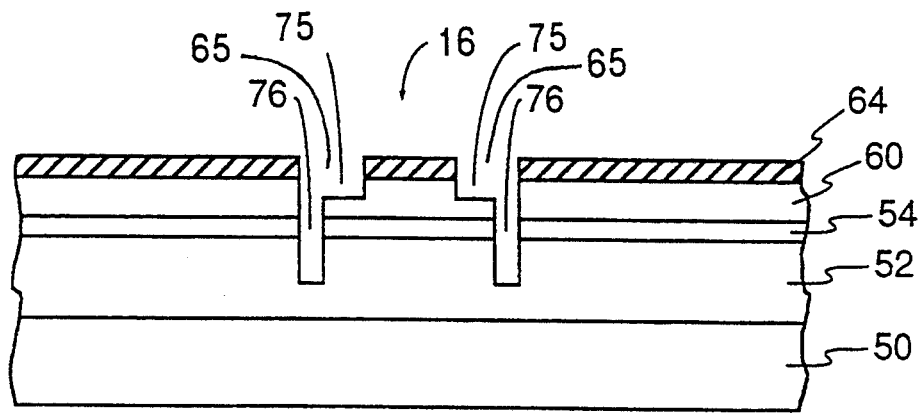
FIG. 5 is a cross-sectional view of the passive output waveguide taken along sectional line 5—5 of FIG. 1.
Figure 6:
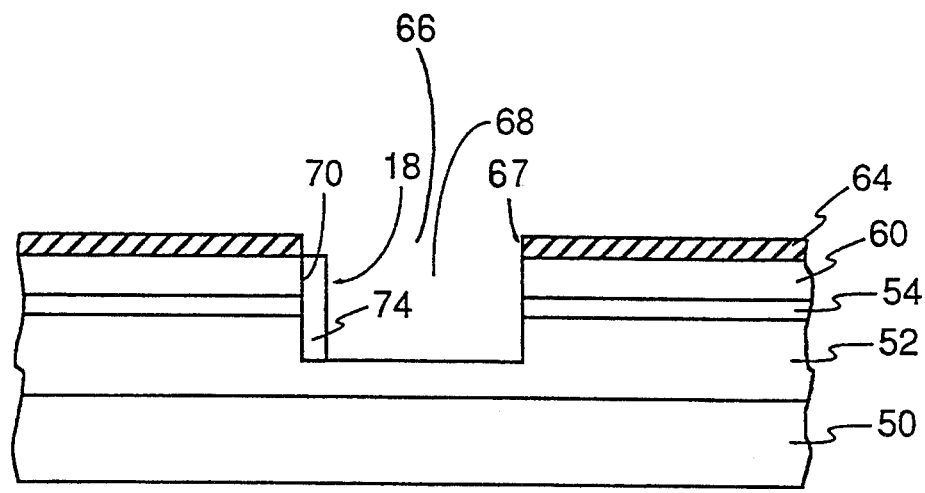
FIG. 6 is a cross-sectional view of the grating trench taken along sectional line 6—6 of FIG. 1.

The integrated laser chip 10 can be grown as illustrated in cross-section in FIG. 4 for the array stripes 14, in FIG. 5 for the passive output waveguide, and in FIG. 6 for the diffraction grating 18. All growth is epitaxial and performed by organo-metallic chemical vapor deposition operating at 76 torr at 620° C. On a (100)-oriented n+-InP substrate 50 is grown an n-type InP buffer layer 52 doped $10^{18}$cm$^{-2}$ with sulfur and having a thickness of 0.5 μm. An InGaAsP waveguide core layer 54 is grown over the buffer layer 52. Its composition is lattice-matched to InP and provides a 1.3 μm bandgap. It is doped n-type to $10^{17}$cm$^{-3}$, and has a thickness of 0.3 μm. An unillustrated thin etch-stop layer of InP is deposited over the core layer 54 to a thickness of 30 nm. The lower 15 nm is n-type at $5\times10^{17}$cm$^{-3}$ while the upper 15 nm is undoped. A multiple quantum-well (MQW) layer 56, illustrated only in FIG. 4 although it is initially deposited in all regions, is grown over the core layer 54. It consists of 6 InGaAs wells with InGaAsP barriers therebetween. The wells are about 8 nm thick while the barriers are about 10 nm thick and their composition has a bandgap of 1.3 μm. Both compositions are lattice-matched to InP. Over the MQW layer 56 is grown an upper p-contact layer 58 consisting of about 0.1 μm of undoped InGaAsP having a 1.3 μm bandgap followed by a 0.1 μm layer of undoped InGaAsP having a 1.2 μm bandgap followed by 0.9 μof InP doped p-type with zinc and graded from $10^{17}$cm$^{-3}$ to $7\times10^{17}$cm$^{-3}$ and then followed by 0.2 μm of InGaAsP doped p-type with $7\times10^{18}$ and having a bandgap of 1.3 μm.

Up to this point, there has been no lateral definition. An SiO$_2$ mask is deposited and patterned with stripes corresponding to the active stripes 14 and extending along the [011] direction. The unmasked regions are first dry etched by ion-milling with argon and then wet etched with H$_3$PO$_4$:H$_2$O$_2$:H$_2$O (1:1:8, by volume using standard reagent concentrations). The etch-stop layer above the core layer 54 defines the bottom of the wet etching. The wet etching is continued until the width of the MQW region is reduced to such a dimension that the fully fabricated stripe 14 supports only single-mode propagation along the stripes. After etching, the chip is returned to the OMCVD chamber for regrowth of a semi-insulating layer 60 of Fe:InP to a thickness of 1 μm. The semi-insulating layer 60 isolates the stripes 14, passivates the sides of the MQW layer 56, and provides an upper cladding in the planar waveguide section extending through the interior of the Rowland circle.

The passive output waveguide 16 of FIG. 5 and the diffraction grating 18 of FIG. 6 are then formed by depositing an SiO$_2$ layer 64 onto the entire area of the integrated circuit chip 10 and patterning this layer with openings 65 to define the output waveguide 16 and with an opening 66 to define the diffraction grating 18. The shape of a rear boundary 67 of the grating opening 66 is nearly arbitrary. The entire area of the integrated circuit chip 10 is then covered with photoresist or other ion-beam resistive material (not shown in the figures). A portion of this resist is then removed so as to expose the opening 66 that defines the grating 18. A trench 68 is then etched through the opening 66 by a process of chemically assisted ion-beam etching using 1500 V Xe+ions and a Cl$_2$ reactive flux, as has been disclosed by Scherer et al. in "Fabrication of microlasers and microresonator optical switches," Applied Physics Letters, vol. 55, 2724–2726, 1989. The trench 68 that is thereby formed defines a vertical wall 70 of the diffraction grating 18. Etch rates of about 0.5 μm per minute are used but are not critical. Tilting of the sample at an angle of approximately 10° with respect to the ion beam provides a highly vertical 3 μm-deep grating wall 70. Angular evaporation onto the grating wall 70 of a reflective layer 74 of 11 nm of Ti and 300 nm of Au provides a highly reflective grating 18. Thereafter, the layer of protective resist is removed from the integrated chip 10. Another resist layer (not shown in the figures) is then deposited onto the integrated chip 10, and an area of this resist is removed so as to expose the openings 65 associated with the output waveguide 16. An ion-beam etch produces shallow trenches 75 around the passive waveguide 16 resulting in a ridge waveguide for single-mode propagation.

An additional mask is used to define deep isolating trenches 76 on each side of the output waveguide 16. The deep trenches 76 may be relatively far outside the shallow trenches 75 and are used to prevent the coupling of spurious scattered light into the output waveguide 16.

The SiO$_2$ layer 64 is patterned for deposition of a p-contact metallization 78, preferably Ti(20 nm)/Au(800 nm). The substrate is thinned, and an unillustrated n-contact metallization is deposited over the bottom of the chip, preferably a multi-layer structure of Ni(10 nm)/Ge(35 nm)/Au(50 nm)/Ni(35 nm)/Au (200 nm). The common n-contact would preferably be replaced with separate contacts to each of the laser stripes. As illustrated in FIG. 1, the chip is cleaved perpendicularly to the active stripes. A metal layer or other highly reflecting coating 80 is deposited on the cleaved face at the end of the active swipes in order to decrease the cavity loss.

The stripe structure of FIG. 4 produces an array of buried double heterojunction lasers which are individual activated by applying a forward bias across the p-contact metallization of the selected laser and the n-contact metallization. More than one laser can be simultaneously selected. The output waveguide of FIG. 5 is not electrically pumped and is thus passive. Accordingly, crosstalk between the channels is substantially reduced. Light is guided between the active stripes, the diffraction grating and the output waveguide by a planar waveguide extending throughout the interior of the Rowland circle.

Partially operable versions of the above embodiment have been fabricated and tested. One version had no passive output waveguide, and its light was output from the exterior end of one or the two active stripes selected at any time. The resultant structure thus resembled Kirkby's. The output stripe was biased at a constant 215 mA, and an injection current of 70–100 mA into the other stripe was required to obtain lasing. Lasing was obtained at 15 discrete wavelengths, from 1507 to 1535 nm with the wavelength distribution departing from linearity by no more than 0.058 nm.

Although the above embodiment is an InP OEIC, the invention can be applied to other active optical semiconductors, such as GaAs, and to other planar optical waveguide structures, for example, silicon or silica. The active devices can be added to the planar waveguide structure by butt-joining, by using various alignment techniques, such as solder-bumps, or by van der Waals bonding following epitaxial lift off of a semiconductor thin film. Other geometries than the Rowland circle are possible. Other forms of diffraction gratings could be used, such as transmissive gratings. Other energy dispersive means such as a distributed feedback grating could be used, and more than one dispersive grating may be included in the cavity.

The invention thus provides a simple multi-wavelength laser which can be designed and fabricated with relatively easy design rules. The values of the lasing wavelengths are determined by the spacing of elements on a scale much larger than those wavelengths. The fabrication of all the lasers and the multiplexer on a single chip reduces the cost and provides a rugged optical system. The described fabrication sequence is fairly standard, and the only regrowth is that of the upper cladding layer, which is not even necessary if other means of isolation and passivation are used. Overall, the critical steps are considered to be the deposition of layers of uniform thickness and composition and the highly vertical and smooth etching of the diffraction grating, which are considered to be well in hand for the described structure.

What is claimed:

1. A multi-wavelength laser comprising
   a substrate;
   a plurality of individually activable laser waveguides formed on said substrate;
   a single passive output waveguide formed on said substrate; and
   a diffraction grating formed on said substrate and operatively linking said laser waveguides and said single passive output waveguide, each laser waveguide, said grating, and said single passive output waveguide comprising a lasing optical resonant cavity whereby lasing wavelengths of said laser waveguides are determined by a geometrical relationship of said laser waveguides, said single passive output waveguide, and said diffraction grating.

2. A multi-wavelength laser as recited in claim 1, further comprising a planar waveguide formed in an area between output ends of said laser waveguide, an input end of said passive output waveguide, and said diffraction grating.

3. A multi-wavelength laser as recited in claim 2, wherein said diffraction grating comprises a vertical wall formed in said planar waveguide.

4. A multi-wavelength laser as recited in claim 3, further comprising a metal layer formed on said vertical wall.

5. A multi-wavelength laser as recited in claim 1, wherein said laser waveguides are positioned such that no light within a gain less loss bandwidth of said laser waveguides sufficient to support lasing is diffracted by said diffraction grating from a first to a second one of said laser waveguides.

6. A multi-wavelength laser as recited in claim 1, wherein light emitted from said laser waveguides and diffracted by said diffraction grating to said passive output waveguide falls within a predetermined bandwidth and no light emitted from one of said laser waveguides within said bandwidth is diffracted by said diffraction grating to another of said laser waveguides.

7. A multi-wavelength laser as recited in claim 1, wherein said diffraction grating extends along a curved path and an optical axis of an input end of said passive output waveguide is aligned with a tangent of said curved path.

8. A multi-wavelength laser as recited in claim 1, wherein said laser waveguides emit at a plurality of respective wavelengths within a bandwidth and said laser waveguides are non-frequency selective within said bandwidth.

9. A multi-wavelength laser comprising
   a substrate;
   a plurality of individual activable laser waveguides formed on said substrate;
   a single passive output waveguide formed on said substrate; and
   a diffraction grating formed on said substrate and operatively linking said laser waveguides and said single passive output waveguide, each laser waveguide, said grating, and said single passive output waveguide comprising a lasing optical resonant cavity whereby lasing wavelengths of said laser waveguides are determined by a geometrical relationship of said laser waveguides, said single passive output waveguide, and said diffraction grating, and wherein output ends of said laser waveguides, an input end of said single passive output waveguide, and said diffraction grating are disposed in a Rowland-circle geometry.

10. A multi-wavelength laser as recited in claim 9, wherein an optical axis of said input end of said output waveguide is aligned with a tangent point of said diffraction grating with a Rowland circle of said Rowland-circle geometry.

* * * * *